(12) United States Patent
Chia et al.

(10) Patent No.: US 7,659,134 B2
(45) Date of Patent: Feb. 9, 2010

(54) MICROELECTRONIC IMAGERS AND METHODS FOR MANUFACTURING SUCH MICROELECTRONIC IMAGERS

(75) Inventors: Yong Poo Chia, Singapore (SG); Yong Loo Neo, Singapore (SG); Meow Koon Eng, Singapore (SG)

(73) Assignee: Aptina Imaging Corporation, Grand Cayman (KY)

( * ) Notice: Subject to any disclaimer, the term of this patent is extended or adjusted under 35 U.S.C. 154(b) by 154 days.

(21) Appl. No.: 11/849,062

(22) Filed: Aug. 31, 2007

(65) Prior Publication Data

US 2009/0014822 A1    Jan. 15, 2009

(51) Int. Cl.
*H01L 21/00*    (2006.01)
(52) U.S. Cl. ............ 438/65; 438/125; 257/E21.503; 257/E21.511
(58) Field of Classification Search ............... 438/65, 438/125, 126; 257/E21.503, E21.511
See application file for complete search history.

(56) References Cited

U.S. PATENT DOCUMENTS

| | | | | |
|---|---|---|---|---|
| 5,647,122 | A * | 7/1997 | Launay et al. | ............... 29/840 |
| 5,952,714 | A | 9/1999 | Sano et al. | |
| 6,774,447 | B2 | 8/2004 | Kondo et al. | |
| 7,112,471 | B2 * | 9/2006 | Boon et al. | ............... 438/116 |
| 7,276,393 | B2 * | 10/2007 | Derderian et al. | ............... 438/51 |
| 2003/0209787 | A1 | 11/2003 | Kondo et al. | |
| 2004/0041221 | A1 | 3/2004 | Boon et al. | |
| 2005/0057883 | A1 | 3/2005 | Bolken et al. | |
| 2005/0253211 | A1 | 11/2005 | Minamio et al. | |
| 2006/0011809 | A1 | 1/2006 | Farnworth et al. | |
| 2006/0251414 | A1 | 11/2006 | Nishizawa | |
| 2009/0045476 | A1 * | 2/2009 | Peng et al. | ............... 257/432 |

FOREIGN PATENT DOCUMENTS

| | | |
|---|---|---|
| EP | 1619881 | 1/2006 |
| EP | 0790652 B1 | 2/2007 |
| JP | 2006333131 | 12/2006 |

OTHER PUBLICATIONS

International Search Report and Written Opinion for International Application No. PCT/US2008/069511, Oct. 16, 2008.

* cited by examiner

*Primary Examiner*—Trung Dang
(74) *Attorney, Agent, or Firm*—Kramer Levin Naftalis & Frankel LLP

(57) ABSTRACT

Microelectronic imagers and methods of manufacturing such microelectronic imagers are disclosed. In one embodiment, a method for manufacturing a microelectronic imager can include irradiating selected portions of an imager housing unit. The housing unit includes a body having lead-in surfaces and a support surface that define a recess sized to receive a microelectronic die. The method also includes depositing a conductive material onto the irradiated portions of the housing unit and forming electrically conductive traces. The method further includes coupling a plurality of terminals at a front side of a microelectronic die to corresponding electrically conductive traces in the recess in a flip-chip configuration. The microelectronic die includes an image sensor aligned with at least a portion of an optical element carried by the housing unit and at least partially aligned with the recess. The method can then include depositing an encapsulant into the recess and over at least a portion of the microelectronic die.

20 Claims, 4 Drawing Sheets

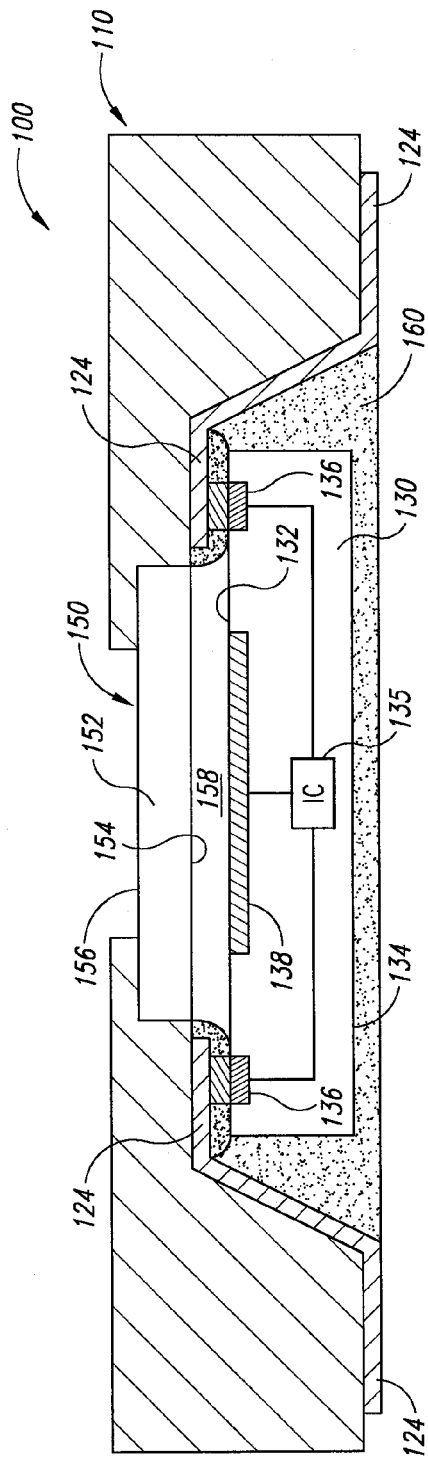
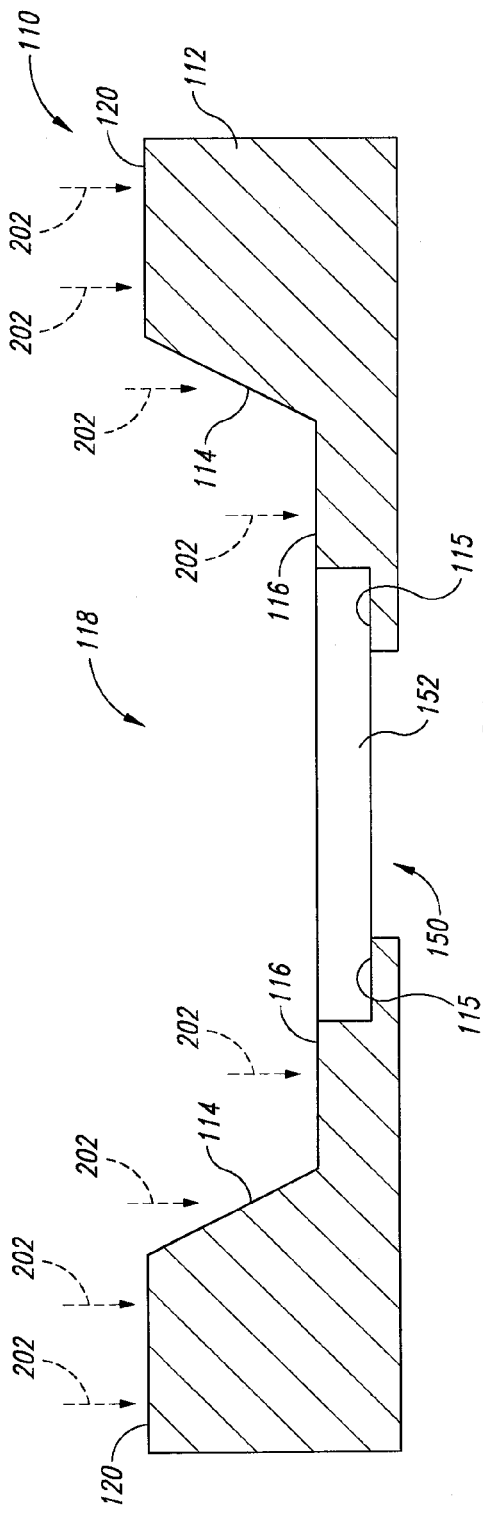
Fig. 1
Fig. 2A

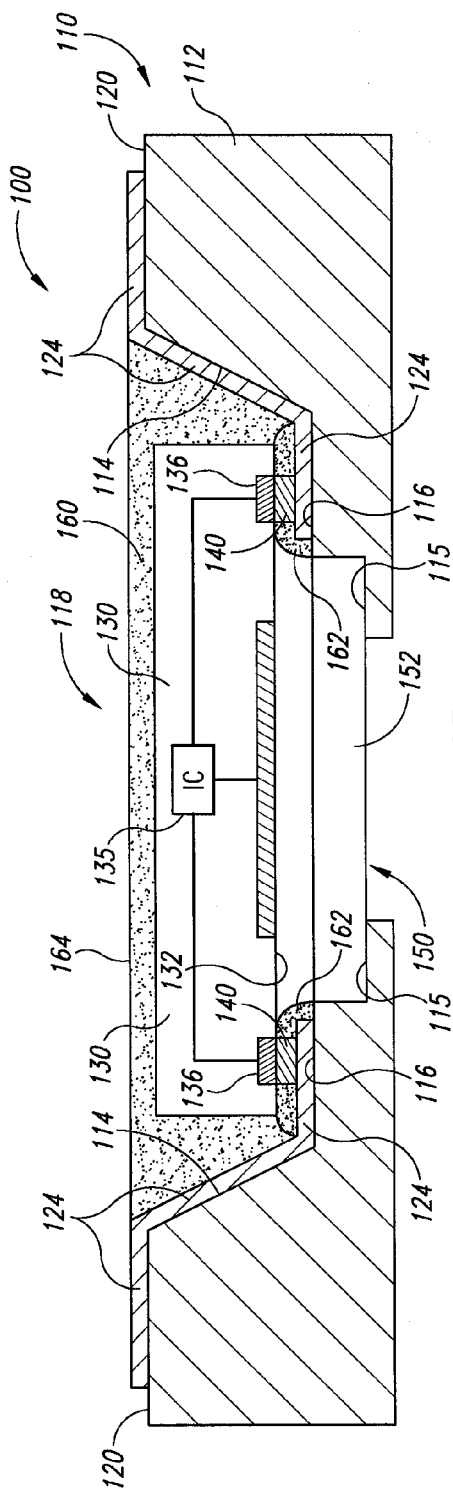
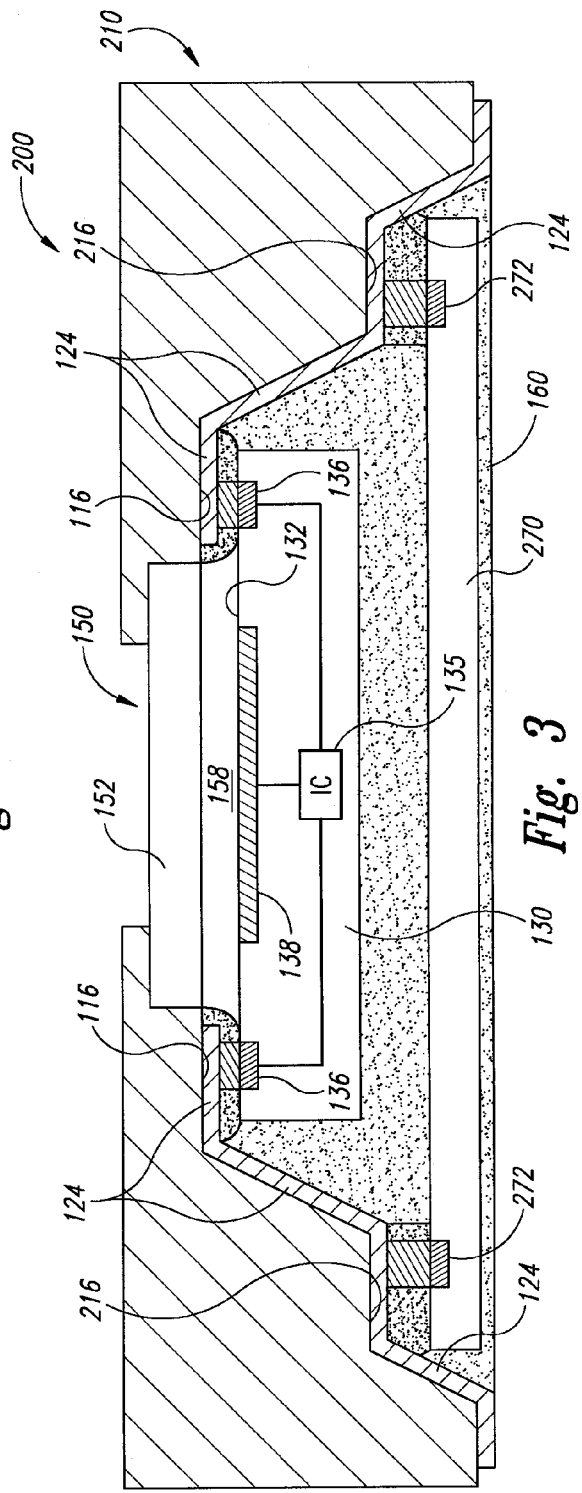

MICROELECTRONIC IMAGERS AND METHODS FOR MANUFACTURING SUCH MICROELECTRONIC IMAGERS

CROSS-REFERENCE TO RELATED APPLICATION

This application claims foreign priority benefits of Singapore Application No. 200705177-4 filed Jul 12, 2007, which is incorporated herein by reference in its entirety.

TECHNICAL FIELD

The present disclosure is related to microelectronic imagers and methods for manufacturing microelectronic imagers.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

Conventional packaged microelectronic imagers, for example, generally include a die, an interposer attached to the die, and a plastic or ceramic housing attached to the interposer and surrounding the periphery of the die. The die includes an image sensor and a plurality of bond-pads electrically coupled to the image sensor. The interposer is typically a dielectric fixture having a plurality of external contacts arranged in a desired array for providing an electrical pathway between the bond-pads on the die and a board or module of another external device. The housing includes a transparent cover to allow light or other forms of radiation to pass through to the image sensor on the die. Conventional imagers further include an optics unit carried by the housing and having a lens positioned at a desired location relative to the image sensor.

BRIEF DESCRIPTION OF THE DRAWINGS

FIG. 1 is a schematic, side cross-sectional view of a microelectronic imager configured in accordance with an embodiment of the disclosure.

FIGS. 2A-2D are schematic, side cross-sectional views illustrating various stages in a method of constructing a microelectronic imager in accordance with an embodiment of the disclosure.

FIG. 3 is a schematic side cross-sectional view of a microelectronic imager configured in accordance with another embodiment of the disclosure.

DETAILED DESCRIPTION

Figure 2B:
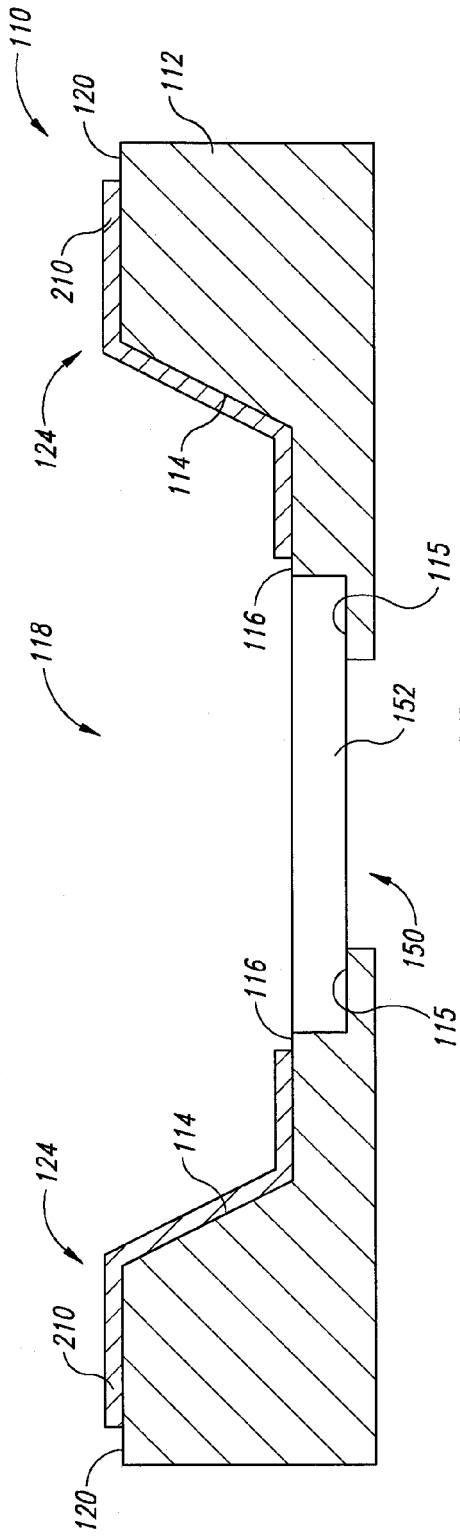

The following disclosure describes several embodiments of methods for manufacturing microelectronic imagers and microelectronic imagers that are formed using such methods. Several details of specific embodiments are described below with reference to CMOS imagers to provide a thorough understanding of these embodiments. CCD imagers or other types of sensors, however, can be used instead of the CMOS imagers in other embodiments. Several details describing well-known structures often associated with microelectronic devices may not be set forth in the following description for the purposes of brevity. Moreover, several other embodiments of the invention can have configurations, components, or procedures different than those described in this section. A person of ordinary skill in the art, therefore, will accordingly understand that the invention may have other embodiments with additional elements, or the invention may have other embodiments without several of the elements shown and described below with reference to FIGS. 1-5.

FIG. 1 is a schematic, side cross-sectional view of an embodiment of a microelectronic imager 100. In this embodiment, the imager 100 includes (a) an imager housing unit or cover unit 110 with a plurality of electrically conductive traces or interconnects 124 on and/or in the housing unit 110, (b) a microelectronic imaging die 130 installed with the housing unit 110 and electrically coupled to the electrically conductive traces 124 in a flip-chip (FCIP) configuration, and (c) an optics unit 150 including one or more optical elements or features attached to the housing unit 110. The imager 100 can also include an encapsulant or molding material 160 covering or otherwise encasing at least a portion of the microelectronic die 130 to protect the delicate imaging components and the interconnections between the microelectronic die 130 and the housing unit 110 from contamination (e.g., moisture, particulates, etc.).

The microelectronic die 130 has a first or active side 132 facing the optics unit 150 and a second or back side 134 opposite the first side 132. The microelectronic die 130, for example, can include integrated circuitry 135 (shown schematically) and a plurality of terminals 136 (e.g., bond-pads) at the front side 132 and electrically coupled to the integrated circuitry 135. The terminals 136 are electrically coupled to corresponding electrically conductive traces 124 on the housing unit 110. The microelectronic die 130 also includes an image sensor 138 at the front side 132 and electrically coupled to the integrated circuitry 135. The image sensor 138 can be a CMOS device or a CCD for capturing pictures or other images in the visible spectrum. In other embodiments, the image sensor 138 can detect radiation in other spectrums (e.g., infrared (IR) or ultraviolet (UV) ranges). In still other embodiments, the microelectronic die 130 can have other arrangements and/or include different features.

The optics unit 150 coupled to the housing unit 110 can include one or more lenses or optical elements for focusing or otherwise directing the desired spectrum of radiation to the image sensor 138 on the microelectronic die 130. In the embodiment illustrated in FIG. 1, for example, the optics unit 150 includes a single cover or window 152 that is attached to the housing unit 110 before the microelectronic die 130 is installed with the housing unit 110. The cover 152 has a first side 154 facing the generally away from the image sensor 138 and a second side 156 facing generally toward the image sensor 138. The cover 152 and the housing unit 110 accordingly form an enclosure 158 for protecting the image sensor 138. The cover 152 can be made of glass, quartz, or other materials transmissive to a desired spectrum of radiation. In embodiments directed toward imaging radiation in the visible spectrum, the cover 152 can have a filter to prevent infrared radiation (IR) or other undesirable spectrums of radiation from reaching the image sensor 138. The cover 152, for example, can be formed from a material and/or have a coating that filters IR or near-IR spectrums. In other embodiments, the optics unit 150 can include other optical structures for performing other functions.

The encapsulant 160 can be disposed onto the assembly and over at least a portion of the microelectronic die 130 and the electrically conductive traces 124. The encapsulant 160 further secures the microelectronic die 130 to the housing unit 110 and further seals the assembly for protecting the imager 100 and its components.

Compared to the conventional imagers described previously, the imager 100 does not include or require a separate interposer substrate to support the microelectronic imaging die 130 and/or the optics unit 150. As described above, the footprint of most conventional imagers is the surface area of the bottom of the interposer. This can be a limiting factor in the design and marketability of smaller electronic devices, such as picture cell phones, PDAs, or other similar devices, because these devices are continually shrinking to be more portable. The pre-molded housing unit 110 in the imager 100 eliminates the need for a separate interposer substrate and can reduce the footprint of the resulting imaging device and provide a robust device with a significantly lower profile than the conventional imagers described above. Thus, the imager 100 can be used in smaller electronic devices or other applications where space is limited.

The manufacturing processes for conventional imaging devices can also be time consuming and require a number of precision assembly sets. Each assembly step increases the opportunity for contamination and/or damage to the delicate components of the image sensor itself. Further, slowing production time to avoid such damage and contamination can significantly increase processing costs. The manufacturing process for the imager 100, however, can be significantly more efficient than processes used to form conventional imagers because there is no need for additional steps or processes to mount the die to both an interposer substrate and a separate housing. Further, as discussed in more detail below, the electrically conductive traces 124 can be formed on the housing unit 110 quickly and precisely without requiring additional masks, tools, or solvents.

In the embodiment illustrated in FIG. 1, formation of the imager 100 is complete. FIGS. 2A-4 described below illustrate additional embodiments of microelectronic imagers and methods for forming such imagers. Although the following description illustrates only forming a single imager, it will be appreciated that a plurality of imagers can be constructed simultaneously.

FIGS. 2A-2D illustrate stages in a method for forming an embodiment of the microelectronic imager 100. FIG. 2A, more specifically, is a partially schematic, cross-sectional view of the housing unit 110 at an initial stage before the electrically conductive traces 124 (FIG. 1) have been formed and before the microelectronic die 130 (FIG. 1) has been attached to the housing unit 110. In previous processing steps, the cover 152 was installed with the housing unit 110. In other embodiments, however, the cover 152 can be installed at a different processing stage. The housing unit 110 can be inverted during processing relative to the orientation of the housing unit 110 shown in FIG. 1 such that the cavity in the housing unit 110 is facing generally upward and more readily accessible.

The housing unit 110 in the illustrated embodiment can include a body 112 having a plurality of lead-in surfaces or sidewalls 114, a cover platform 115, and a support surface 116 between the corresponding lead-in surfaces 114 and the cover platform 115. The lead-in surfaces 114 and support surface 116 define a recess 118 for receiving the microelectronic die 130. The lead-in surfaces 114 taper inwardly away from a bottom surface 120 to the support surface 116 to at least partially align the microelectronic die 130 in the housing unit 110. The support surface 116 provides a fixed surface at a known position for accurately positioning the image sensor 138 (FIG. 1) relative to the optics unit 150. The body 112 can be a pre-formed component formed using a suitable injection molding process. The body 112 can composed of a molding compound (e.g., liquid crystal polymer (LCP), polyphenylene sulfide (PPS)) or another suitable photo-reactive thermoplastic material. In other embodiments, however, the body 112 can have other configurations and/or can be composed of different materials. For example, the body 112 may include one or more non-tapered lead-in surfaces or sidewalls extending from the bottom surface 120 to the support surface 116.

A laser (not shown) can be used to selectively react or ablate material from one or more portions of the body 112. More specifically, the laser can direct one or more laser beams 202 (shown in broken lines) toward the body 112 to irradiate selected portions of the support surface 116, the lead-in surfaces 114, and the bottom surface 120. In embodiments where the body 112 is composed, at least in part, of a photo-reactive (e.g., laser-activatable) thermoplastic material, the laser beam induces a physicochemical reaction in the material that in turn creates a suitable surface for the electrically conductive traces that will subsequently be formed on and/or in the body 112 at the corresponding irradiated portions. More specifically, the laser beams 202 can activate a metal complex in the thermoplastic material and cause the metal atoms in the material to break off from the corresponding organic ligands. These metal particles at the activated areas on the body 112 can act as nuclei for subsequent metallization or plating processes. The laser beams 202 can also create very small, irregular surfaces on the body 112 because the laser only reacts or ablates a portion of the thermoplastic material. The resulting irregularities provide anchor points for the one or more conductive materials that will be deposited onto the body 112 during the metallization or plating processes. This irradiation process and the subsequent metallization or plating process are commonly referred to as "Molded Interconnect Device" technology. Further details regarding this process are described below with reference to FIG. 2B.

The laser can selectively irradiate the body 112 in an efficient and precisely controlled process. For example, the laser can be programmable and, accordingly, the laser reaction or ablation process can be automated such that the laser can selectively irradiate one or more body portions without requiring any intervention. Furthermore, the irradiation process of FIG. 2A does not require any external masks or tools to form the patterns on the body 112. Rather, the desired trace patterns can be transferred directly onto the body 112 quickly and efficiently using the laser. Moreover, the irradiation process described herein does not require any external solvents or chemicals to be applied to the body 112 before, during, or after processing. The irradiation process is accordingly expected to be less expensive and time-consuming than conventional processes that require such features.

The laser can direct either a continuous wave laser beam or a pulsed laser beam to selectively ablate the body 112. The configuration of the laser and the desired beam characteristics (e.g., wavelength, continuous or pulsed beam, etc.) can vary depending on the material(s) of which the body 112 is composed and the desired ablation pattern on the body 112. Suitable laser systems include the Starships laser commercially available from Rofin-Sinar of Plymouth, Mich., and the Xise200 laser commercially available from Xsil Ltd. of Dublin, Ireland.

Referring next to FIG. 2B, one or more conductive materials 210 are deposited onto the activated (e.g., irradiated or ablated) portions of the body 112 to form the electrically conductive traces or interconnects 124 in the desired pattern. The electrically conductive traces 124, for example, can extend across at least a portion of the bottom surface 120, the lead-in surfaces 114, and the support surface 116. As discussed above, the activated portions of the body 112 include metal particles that act as nuclei for the metallization or plating process. In one embodiment, for example, the metallization process can include depositing the conductive material(s) 210 onto the activated portions of the body 112 in a stacked arrangement with (a) a layer of Cu, (b) a layer of Au, and (c) an Au flash plating or layer. In another embodiment, the conductive material(s) 210 deposited onto the body 112 can include a stacked layer build-up with (a) a layer of Al, (b) a layer of Ni, and (c) a layer of palladium. In still further embodiments, however, the one or more conductive materials 210 deposited onto the body 112 can include a single conductive material, a different combination of materials, and/or a different number of layers. In any of these embodiments, the conductive material(s) 210 can be deposited onto the activated portions of the body 112 using an electroless plating process, an immersion process, or another suitable technique. In the embodiment illustrated in FIG. 2B, the resulting housing unit 110 with the plurality of conductive traces 124 is accordingly a Molded Interconnect Device that includes a molded structure incorporating a plurality of integral conductive traces or electrical lines in a desired arrangement at an external surface of the housing unit 110.

Figure 2C:
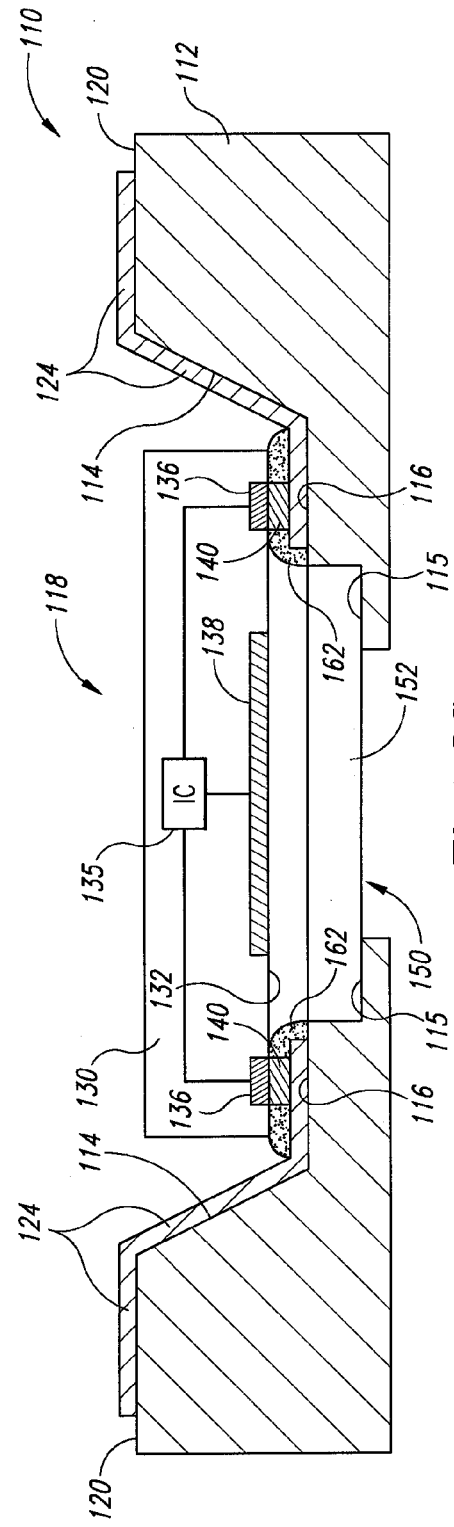

Referring next to FIG. 2C, the microelectronic die 130 is installed with the housing unit 110 and electrically coupled to corresponding electrically conductive traces 124 in a FCIP configuration. More specifically, a plurality of conductive bumps or stud bumps 140 can be formed on corresponding terminals 136 on the microelectronic die 130 before the die is installed with the housing unit 110. After forming the conductive bumps 140 on the terminals 136, the bumps can be coupled to corresponding portions of the conductive traces 124 at the support surface 116 of the housing unit 110. In one embodiment, the conductive bumps 140 can be composed of a solder material and a suitable reflow process can be used to physically and electrically couple the conductive bumps 140 to the corresponding portions of the conductive traces 124. In another embodiment, the conductive bumps 140 can be composed of Au or Au alloy and a suitable compression process can be used to physically and electrically couple the conductive bumps 140 to the respective conductive traces 124. In still other embodiments, the conductive bumps 140 can be composed of different materials and/or other processes can be used to couple the bumps 140 to the corresponding portions of the conductive traces 124.

A volume of adhesive material 162 can be disposed between the front side 132 of the microelectronic die 130 and the housing unit 110 to further attach the die 130 to the housing unit 110 and to protect the terminals 136, conductive bumps 140, and corresponding portions of the conductive traces 124 from contamination (e.g., moisture, particulates, etc.). The adhesive material 162 can include an anisotropic conductive film or paste, a non-conductive film or paste, or other suitable materials. The adhesive material 162 can be disposed onto the assembly either before or after installing the microelectronic die 130 with the housing unit 110. The adhesive material 162 accordingly provides (a) mechanical strength along the interface between the microelectronic die 130 and the housing unit 110, and (b) an insulative layer to protect the interconnect structures between the 130 and the housing unit 110.

Referring to FIG. 2D, the encapsulant 160 can be deposited into the recess 118 and over at least a portion of the microelectronic die 130 to complete the imager 100. The encapsulant 160 can include a molding compound or another suitable material. As discussed above, the encapsulant 160 further secures the microelectronic die 130 to the housing unit 110 and further seals the assembly for protecting the imager 100 and its components. In the illustrated embodiment, the microelectronic die 130 is completely encapsulated and an outer surface 164 of the encapsulant 160 is at least generally flush with an upper surface 122 of the housing unit 110. In other embodiments, however, at least a portion of the back side 134 of the microelectronic die 130 may be exposed to the external environment and/or the outer surface 164 of the encapsulant 160 may not be flush with the upper surface 122.

FIG. 3 is a schematic, side cross-sectional view of a microelectronic imager 200 configured in accordance with another embodiment of the invention. Like reference numbers refer to like components in FIGS. 1-2D and FIG. 3. The imager 200 differs from the imager 100 described above in that the imager 200 includes a pre-molded housing unit 210 with support surfaces 216 and one or more additional semiconductor components or devices 270 (only one is shown) installed within the housing unit 210 at the additional support surfaces 216. The semiconductor component 270 can include, for example, a processor, a logic-type device, a controller, a memory device, or another suitable device. The semiconductor component 270 can include a plurality of terminals 272 electrically coupled to corresponding electrically conductive traces 124. The traces 124 accordingly provide an electrical pathway between the microelectronic die 130, the semiconductor component 270, and a board or module of an external device (not shown). The encapsulant 160 can be disposed into the recess or cavity in the housing unit 210 to encapsulate both the microelectronic die 130 and at least a portion of the semiconductor component 270.

Figure 4:
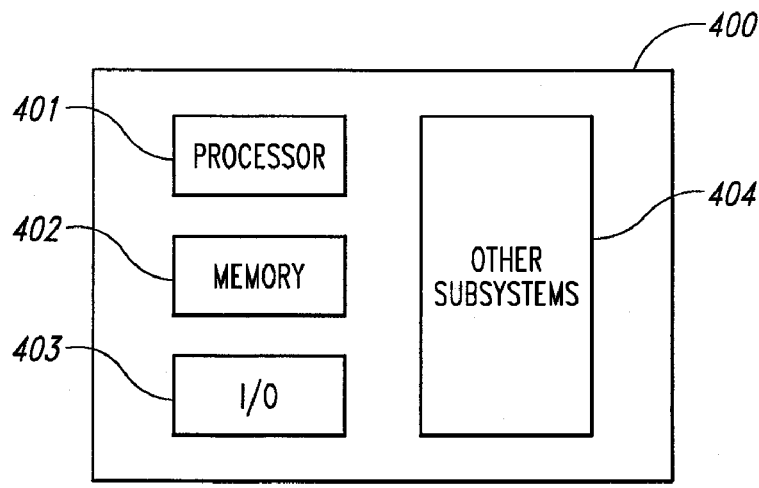
FIG. 4 is a schematic view of a system incorporating one or more microelectronic imagers.

Any one of the imager components described above with reference to FIGS. 1-3 can be incorporated into any of a myriad of larger and/or more complex systems, a representative example of which is system 500 shown schematically in FIG. 4. The system 400 can include a processor 401, a memory 402 (e.g., SRAM, DRAM, flash, and/or other memory device), input/output devices 403, and/or other subsystems or components 404. The foregoing imager devices described above with reference to FIGS. 1-3 may be included in any of the components shown in FIG. 4. The resulting system 400 can perform any of a wide variety of computing, processing, storage, sensing, imaging, and/or other functions. Accordingly, representative systems 400 include, without limitation, cameras, computers and/or other data processors, for example, desktop computers, laptop computers, Internet appliances, hand-held devices (e.g., palm-top computers, wearable computers, cellular or mobile phones, personal digital assistants, etc.), light or other radiation sensors, multiprocessor systems, processor-based or programmable consumer electronics, network computers, and minicomputers.

Other representative systems 400 include servers and associated server subsystems, display devices, and/or memory devices. Components of the system 400 may be housed in a single unit or distributed over multiple, interconnected units (e.g., through a communications network). The components of the system 400 can accordingly include local and/or remote memory storage devices, and any of a wide variety of computer readable media.

Figure 5:
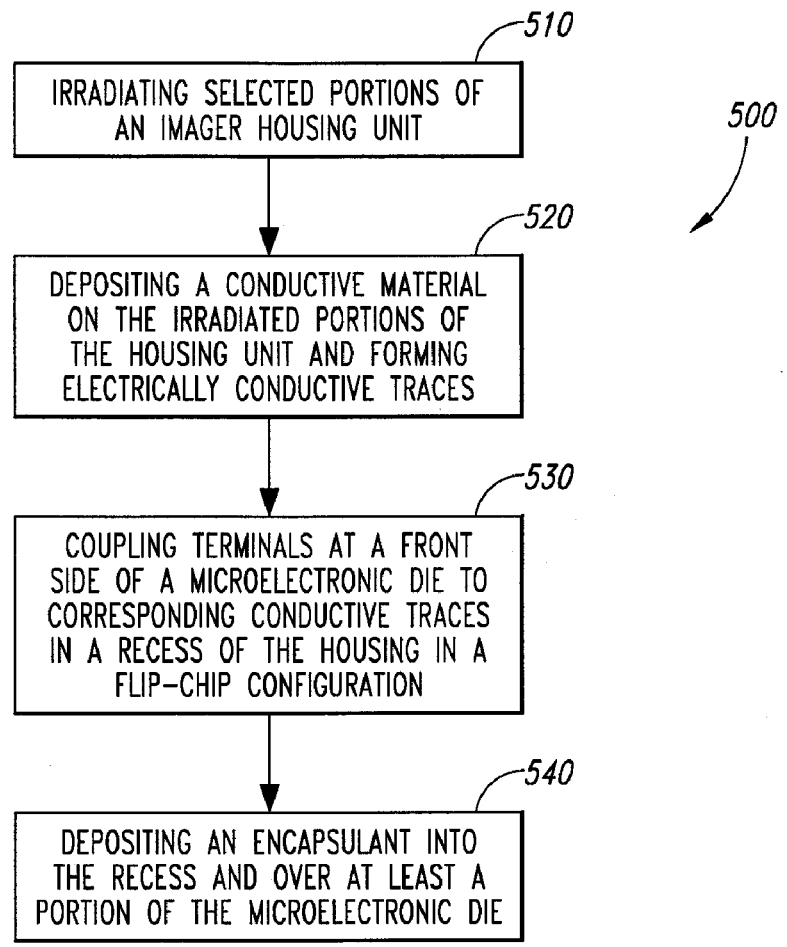
FIG. 5 is a flow chart illustrating a method for manufacturing a microelectronic imager.

FIG. 5 is a flow chart of a method 500 for manufacturing a microelectronic imager in accordance with one embodiment of the disclosure. The method 500 can include irradiating selected portions of an imager housing unit (block 510). The housing unit includes a body having lead-in surfaces and a support surface that define a recess sized to receive a microelectronic die. The method 500 also includes depositing a conductive material onto the irradiated portions of the housing unit and forming electrically conductive traces (block 520). The method 500 further includes coupling a plurality of terminals at a front side of a microelectronic die to corresponding electrically conductive traces in the recess in a flip-chip configuration (block 530). The microelectronic die includes an image sensor aligned with at least a portion of an optical element carried by the housing unit and at least partially aligned with the recess. The method can then include depositing an encapsulant into the recess and over at least a portion of the microelectronic die (block 540).

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature (s) such that any greater number of the same feature and/or additional types of other features are not precluded. It will also be appreciated that specific embodiments have been described herein for purposes of illustration, but that various modifications may be made without deviating from the invention. In particular, for example, the housing units 110 and 210 described above can have a different shape or configuration and/or include different features than those described above. Accordingly, the invention is not limited except as by the appended claims.

We claim:

1. A method of manufacturing a microelectronic imager, the method comprising:
    irradiating selected portions of an imager housing unit, the imager housing unit including a body having a recess sized to receive a microelectronic die, the recess including lead-in surfaces and a support surface;
    depositing a conductive material onto the irradiated portions of the housing unit and forming electrically conductive traces;
    coupling a plurality of terminals at a front side of a microelectronic imaging die to corresponding electrically conductive traces in the recess in a flip-chip configuration, wherein the microelectronic die includes an image sensor aligned with at least a portion of an optical element carried by the housing unit and at least partially aligned with the recess; and
    depositing an encapsulant into the recess and over at least a portion of the microelectronic die.

2. The method of claim 1 wherein irradiating selected portions of an imager housing unit comprises impinging a laser beam on the body of the housing unit and activating the selected portions.

3. The method of claim 1 wherein irradiating selected portions of an imager housing unit comprises impinging a laser beam on the body of the housing unit without the use of a mask or reticle.

4. The method of claim 1 wherein the housing unit is composed, at least in part, of a molding compound, and wherein:
    irradiating selected portions of an imager housing unit comprises impinging a laser beam upon selected portions of the molding compound and activating the affected portions of the molding compound; and
    depositing a conductive material onto the irradiated portions comprises using a metallization process to deposit a conductive material onto the affected portions of the molding compound.

5. The method of claim 1 wherein irradiating selected portions of an imager housing unit comprises irradiating a housing unit composed of at least one of liquid crystal polymer (LCP) and polyphenylene sulfide (PPS).

6. The method of claim 1 wherein the optical element includes a cover unit transmissive to a desired spectrum of radiation, and wherein the method further comprises installing the cover unit with the housing unit before irradiating selected portions of the housing unit.

7. The method of claim 1 wherein irradiating selected portions of an imager housing unit comprises irradiating the body with a laser beam having one or more selected characteristics based, at least in part, on one or more materials of which the body is composed.

8. The method of claim 1 wherein depositing a conductive material onto the irradiated portions of the housing unit comprises depositing one or more layers of conductive material using at least one of an electroless plating process and an immersion process.

9. The method of claim 1 wherein depositing a conductive material onto the irradiated portions of the housing unit comprises depositing (a) a layer of Cu, (b) a layer of Ni, and (c) an Au flash plating or layer.

10. The method of claim 1 wherein depositing a conductive material onto the irradiated portions of the housing unit comprises depositing (a) a layer of Al, (b) a layer of Ni, and (c) a layer of paladium.

11. The method of claim 1, further comprising disposing a volume of adhesive material between the front side of the microelectronic die and the housing unit, and wherein the adhesive material comprises at least one of an anisotropic conductive film, an anisotropic conductive paste, a non-conductive film, and a non-conductive paste.

12. The method of claim 1, further comprising forming a plurality of conductive bumps on corresponding terminals on the microelectronic die before coupling the terminals of the microelectronic die to corresponding conductive traces, and wherein coupling a plurality of terminals at a front side of a microelectronic die to corresponding electrically conductive traces in a flip-chip configuration comprises coupling the conductive bumps on the terminals to corresponding electrically conductive traces on the housing unit.

13. The method of claim 1, further comprising:
    attaching and electrically coupling one or more additional semiconductor components to the electrically conductive traces in the recess, and wherein the microelectronic die is between the optical element and the one or more semiconductor components; and wherein depositing an encapsulant into the recess and over at least a portion of the housing unit and the microelectronic die further comprises depositing the encapsulant over at least a portion of the one or more additional semiconductor components.

14. The method of claim 13 wherein attaching and electrically coupling one or more additional semiconductor components to the electrically conductive traces in the recess comprises attaching and electrically coupling at least one of a processor, a logic-type device, a controller, and a memory device.

15. The method of claim 1 wherein the body of the housing unit has a first major surface and a second major surface opposite the first major surface, and wherein the lead-in surfaces and the recess are in the first major surface, and wherein:

depositing an encapsulant into the recess and over at least a portion of the housing unit and the microelectronic die comprises completely encapsulating the microelectronic die with the encapsulant and forming an outer encapsulate surface, the outer surface being at least generally flush with the first major surface of the body of the housing unit.

16. A method of fabricating a microelectronic imager, the method comprising:

juxtaposing conductive bumps at a front side of a microelectronic die with one or more conductive traces in a cavity of a pre-molded imager housing, the housing being composed, at least in part, of a photo-reactive thermoplastic material, and wherein the microelectronic die includes an image sensor at the front side of the microelectronic die and at least partially aligned with one or more optical elements carried by the housing and aligned with the cavity;

physically and electrically attaching the conductive bumps to the corresponding conductive traces; and depositing an encapsulant into the cavity to at least partially encapsulate the microelectronic die.

17. The method of claim 16 wherein juxtaposing conductive bumps of a microelectronic die with one or more conductive traces in a cavity of a pre-molded imager housing comprises locating the microelectronic die completely within the cavity in a flip-chip configuration.

18. The method of claim 16, further comprising disposing a volume of adhesive material between the front side of the microelectronic die and the housing and adjacent to the conductive bumps on the microelectronic die either before or after physically and electrically attaching the conductive bumps to the corresponding traces.

19. The method of claim 18 wherein disposing a volume of adhesive material between the front side of the microelectronic die and the housing comprises disposing the material adjacent to the conductive bumps and out of contact with the image sensor and at least portion of the one or more optical elements.

20. A method of constructing a microelectronic imager, the method comprising:

locating a microelectronic die including an image sensor within a cavity in a Molded Interconnect Device (MID), wherein the image sensor is facing and spaced apart from an optical element carried by the MID;

attaching a plurality of terminals at a front side of the microelectronic die to corresponding conductive trace portions of the MID within the cavity;

applying a volume of adhesive material between the front side of the microelectronic die and the MID and out of contact with the image sensor and at least a portion of the optics unit; and encapsulating the microelectronic die.

* * * * *